(12) United States Patent
Kim et al.

(10) Patent No.: US 11,282,995 B2
(45) Date of Patent: Mar. 22, 2022

(54) DISPLAY MODULE PACKAGE

(71) Applicant: Samsung Electronics Co., Ltd., Suwon-si (KR)

(72) Inventors: Dahye Kim, Gwangmyeong-si (KR); Seokhyun Lee, Hwaseong-si (KR); Jungho Park, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 135 days.

(21) Appl. No.: 16/860,255

(22) Filed: Apr. 28, 2020

(65) Prior Publication Data

US 2021/0066560 A1   Mar. 4, 2021

(30) Foreign Application Priority Data

Aug. 30, 2019  (KR) .................. 10-2019-0107476

(51) Int. Cl.
| | |
|---|---|
| *H01L 33/62* | (2010.01) |
| *H01L 33/48* | (2010.01) |
| *H01L 33/56* | (2010.01) |
| *H01L 25/16* | (2006.01) |
| *H01L 25/00* | (2006.01) |
| *H01L 25/075* | (2006.01) |
| *H01L 23/29* | (2006.01) |
| *H01L 23/31* | (2006.01) |
| *H01L 23/485* | (2006.01) |
| *H01L 23/525* | (2006.01) |
| *H01L 27/15* | (2006.01) |

(52) U.S. Cl.
CPC ............ *H01L 33/62* (2013.01); *H01L 33/486* (2013.01); *H01L 33/56* (2013.01)

(58) Field of Classification Search
CPC ............... H01L 33/486; H01L 23/3135; H01L 23/5389; H01L 25/167; H01L 25/18; H01L 24/24
See application file for complete search history.

(56) References Cited

U.S. PATENT DOCUMENTS

| | | | |
|---|---|---|---|
| 8,680,667 B2 | 3/2014 | Kwon et al. | |
| 9,929,022 B2 | 3/2018 | Lee et al. | |
| 10,249,598 B2 | 4/2019 | Meyer et al. | |
| 10,276,548 B2 | 4/2019 | Chen et al. | |
| 2017/0084583 A1 | 3/2017 | Lin et al. | |
| 2019/0006339 A1 | 1/2019 | Lau et al. | |
| 2019/0116697 A1 | 4/2019 | Wu | |
| 2019/0131242 A1 | 5/2019 | Lee et al. | |
| 2021/0005761 A1* | 1/2021 | Tsai | ............ H01L 31/173 |

* cited by examiner

*Primary Examiner* — Marcos D. Pizarro
*Assistant Examiner* — Antonio B Crite
(74) *Attorney, Agent, or Firm* — Muir Patent Law, PLLC

(57) ABSTRACT

A display module package includes a semiconductor chip, a wiring member disposed on the semiconductor chip, including an insulating layer and a wiring layer, and contacting at least a portion of the semiconductor chip, a light emitting device array disposed on the wiring member and including a plurality of light emitting devices disposed on one surface, wherein the wiring member is between the semiconductor chip and the light emitting device, and a molding member disposed on the wiring member, sealing part of the light emitting device array, and having an opening for exposing the plurality of light emitting devices.

20 Claims, 13 Drawing Sheets

II-II'

III-III'

III-III'

DISPLAY MODULE PACKAGE

CROSS-REFERENCE TO RELATED APPLICATION(S)

This application claims the benefit of priority to Korean Patent Application No. 10-2019-0107476 filed on Aug. 30, 2019 in the Korean Intellectual Property Office, the disclosure of which is incorporated herein by reference in its entirety.

BACKGROUND

Example embodiments of the present inventive concept relate to a display module package.

As a display panel of an electronic device, a display panel in which a light emitting diode (LED) emitting red (R), green (G), and blue (B) light is directly mounted on a substrate has emerged. For a small-sized device such as a wearable device, there has been continuous research to develop a display having reduced weight, a reduced size, high resolution, and high functionality.

SUMMARY

An example embodiment of the present inventive concept is to provide a display module package having a reduced thickness and a reduced size.

Another example embodiment of the present inventive concept is to provide a display module package which may reduce a response delay time of a display.

According to an example embodiment of the present inventive concept, a display module package includes a first wiring layer structure having a first wiring layer, a semiconductor chip disposed on the first wiring layer structure and electrically connected to the first wiring layer of the first wiring layer structure, a first molding member disposed on the first wiring layer structure and encapsulating at least a portion of the semiconductor chip, a second wiring layer structure disposed on the semiconductor chip and the first molding member and having a second wiring layer, a vertical connection electrode disposed between the first wiring layer structure and the second wiring layer structure and electrically connecting the first wiring layer to the second wiring layer, a light emitting device array disposed on the second wiring layer structure, electrically connected to the second wiring layer, having a first surface facing the second wiring layer structure and a second surface opposite the first surface, and including a plurality of light emitting devices disposed on the second surface, and a second molding member disposed on the second wiring layer structure and sealing part of the light emitting device array to expose the plurality of light emitting devices.

According to an example embodiment of the present inventive concept, a display module package includes a semiconductor chip, a wiring member disposed on the semiconductor chip, including an insulating layer and a wiring layer, and contacting at least a portion of the semiconductor chip, a light emitting device array disposed on the wiring member and including a plurality of light emitting devices disposed on one surface, wherein the wiring member is between the semiconductor chip and the light emitting device, and a molding member disposed on the wiring member, sealing part of the light emitting device array, and having an opening for exposing the plurality of light emitting devices.

According to an example embodiment of the present inventive concept, a display module package includes a first wiring member including a first wiring layer and connection terminals electrically connected to the first wiring layer, a semiconductor chip disposed on the first wiring member and including connection members electrically connected to the first wiring layer, an underfill resin disposed between the first wiring member and the semiconductor chip and covering the connection members, a first molding member disposed on the first wiring member, and sealing the semiconductor chip and the underfill resin, a second wiring member disposed on the semiconductor chip and the first molding member, and including an insulating layer and a second wiring layer disposed on the insulating layer, a vertical connection electrode disposed between the first wiring member and the second wiring member, penetrating the first molding member, and electrically connecting the first wiring member to the second wiring member, a light emitting device array disposed on the second wiring member, including a plurality of light emitting devices disposed on one surface, and electrically connected to the second wiring member through a bonding wire, an attachment member disposed between the second wiring member and the light emitting device array, and a second molding member disposed on the second wiring member, encapsulating the bonding wire and part of the light emitting device array, and having an opening for exposing the plurality of light emitting devices, and the second wiring member contacts the semiconductor chip and the first molding member.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, embodiments of the present inventive concept will be described as follows with reference to the accompanying drawings.

Figure 1:
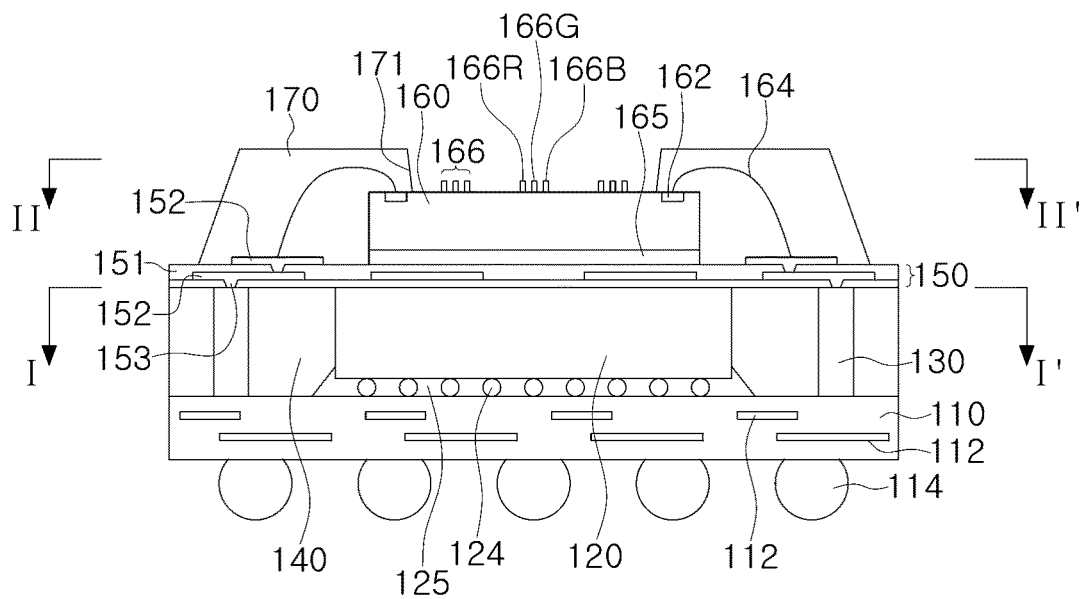
FIG. 1 is a side cross-sectional diagram illustrating a display module package according to an example embodiment of the present inventive concept.
Figure 2:
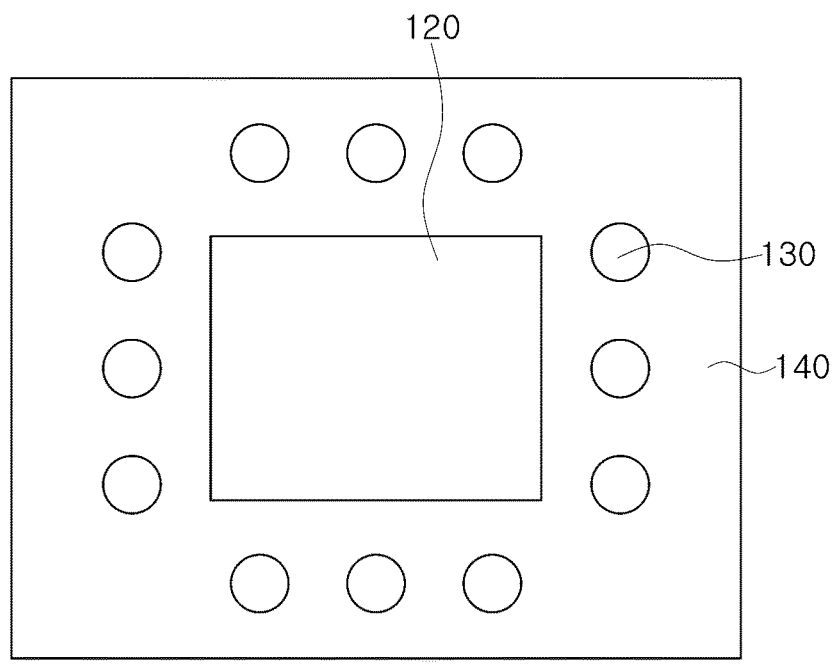
FIG. 2 is a cross-sectional diagram taken along line I-I' in FIG. 1.
Figure 3:
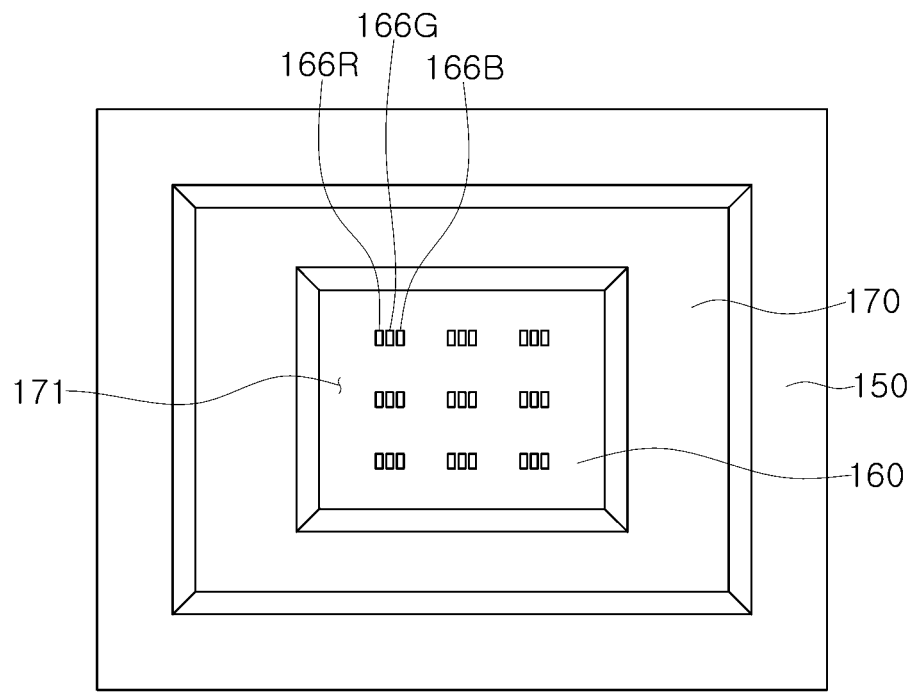
FIG. 3 is a cross-sectional diagram taken along line II-IF in FIG. 1.

FIG. 1 is a side cross-sectional diagram illustrating a display module package 100A according to an example embodiment. FIG. 2 is a cross-sectional diagram taken along line I-I' in FIG. 1. FIG. 3 is a cross-sectional diagram taken along line II-IF in FIG. 1.

Referring to FIGS. 1 to 3, the display module package 100A may include a first wiring member 110, a semiconductor chip 120, an interconnect member 130, a first molding member 140, a second wiring member 150, a light emitting device array 160, and a second molding member 170.

The display module package 100A may include the light emitting device array 160 including a plurality of light emitting devices 166 arranged therein, and the semiconductor chip 120 configured to control the plurality of light emitting devices 166 to turn on.

The first wiring member 110 may be configured as a substrate used in a semiconductor package, such as a printed circuit board (PCB), a ceramic substrate, a tape wiring substrate, and the like, and may be referred to as a substrate, wiring substrate or package substrate. For example, the first wiring member 110 may include a thermosetting resin such as an epoxy resin, a thermoplastic resin such as polyimide. For instance, the first wiring member 110 may include prepreg, an Ajinomoto built-up film, FR-4, bismaleimide triazine, and the like. The first wiring member 110 may also include a photoimagable dielectric resin (PID). In this case, the first wiring member 110 may have a wiring pattern of a fine pitch using a photolithography process.

The first wiring member 110 may include a plurality of pads (not illustrated) disposed on an upper surface and a lower surface of the first wiring member 110 opposite each other, respectively, and a first wiring layer 112 electrically connecting the plurality of pads to each other. Pads as described herein may be conductive terminals connected to internal wiring of a device or substrate, and may transmit signals and/or supply voltages between an internal wiring and/or internal circuit of the device or substrate and an external source. For example, chip pads of a semiconductor chip may electrically connect to and transmit supply voltages and/or signals between an integrated circuit of the semiconductor chip and a device to which the semiconductor chip is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

The first wiring member 110 may further include be connected to connection terminals 114 connected to the pads (not illustrated) disposed on the lower surface of the first wiring member 110 in a lower portion of the first wiring member 110. The connection terminals 114 may be disposed in a region overlapping the semiconductor chip 120 or in a region which does not overlap the semiconductor chip 120, from a top-down view, on a lower surface of the first wiring member 110. Accordingly, at least a portion of connection terminals 113 may be vertically disposed in a region which does not overlap the semiconductor chip 120 from a top-down view.

The connection terminals 114, also described as conductive interconnection terminals, or as external connection terminals, may be electrically connected to an external device such as a mainboard, and the like, and may electrically and physically connect a package substrate to the external device. For example, the connection terminals 114 may have a flip-chip connection structure having a grid array such as a solder ball, a conductive bump or a pin grid array, a ball grid array, and a land grid array.

The semiconductor chip 120 may be disposed on the first wiring member 110 and may be electrically connected to the first wiring layer 112 of the first wiring member 110. For example, the semiconductor chip 120 may be mounted on the first wiring member 110 through connection members 124 disposed on connection electrodes (not illustrated) disposed on an active surface (a lower surface of the semiconductor chip 120 in FIG. 1) by a flip-chip bonding method. The connection members 124 may be conductive interconnections and include a solder bump or ball, or a copper pillar. An underfill resin 125 including an epoxy resin, or the like, that encloses the connection members 124 may be disposed between the active surface of the semiconductor chip 120 and an upper surface of the first wiring member 110.

However, example embodiments thereof are not limited to the aforementioned example embodiments, and in example embodiments, the semiconductor chip 120 may be mounted on the first wiring member 110 by a wire bonding method.

The semiconductor chip 120 may include an integrated circuit IC transmitting a lighting signal of the plurality of light emitting devices 166. For example, the semiconductor chip 120 may include a central processor (for example, a central processing unit (CPU)), a graphics processor (for example, a graphics processing unit (GPU)), a digital signal processor, a cryptographic processor, a microprocessor, a microcontroller, or the like, a logic chip such as an analog-to-digital (ADC) converter, an application-specific integrated circuit (ASIC), or the like. However, an example embodiment thereof is not limited thereto, and other types of chip related components may be included. The semiconductor chip 120 may also include a driver IC configured to control the plurality of light emitting devices 166 to turn on. The semiconductor chip 120 may include one or more integrated circuit dies to implement these various semiconductor devices.

The interconnect member 130 (described in the singular, but actually including a plurality of members) may be disposed between the first wiring member 110 and the second wiring member 150 and may electrically connect the first wiring layer 112 to a second wiring layer 152. The interconnect member 130 may be formed using a conductive material such as copper (Cu), aluminum (Al), silver (Ag), tin (Sn), gold (Au), nickel (Ni), lead (Pb), titanium (Ti), or alloys thereof. The interconnect member 130 may have a pillar shape with a cross-sectional surface of various shapes (e.g., circular, square, etc.), or may configured as a structure in which an electrical path is formed upwardly and downwardly.

For example, the interconnect members 130 may be disposed at an outer region of the first wiring member 110 and may surround the semiconductor chip 120 with a predetermined gap between side surfaces of the semiconductor chip 120 and each first interconnect member 130, and may be configured as a conductive post penetrating the first molding member 140. Generally, interconnect members 130 may be described as conductive through vias, or vertical conductive through vias.

The first molding member 140 may be disposed on the first wiring member 110, and may seal at least a portion of the semiconductor chip 120. The first molding member 140 may be configured to enclose and encapsulate at least a portion of the semiconductor chip 120, and may be described as a first encapsulant. For example, the first molding member 140 may enclose a side surface of the semiconductor chip 120 and an upper surface of the first molding member 140 may be coplanar with an upper surface of the semiconductor chip 12 and an upper surface of the interconnect member 130. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

As for the configuration in which the surfaces are coplanar with one another, upper surfaces of the first molding member 140, the semiconductor chip 120, and the interconnect member 130 may be planarized and coplanar with one another by a grinding process. In this case, an upper portion of the semiconductor chip 120 may be partially removed by a grinding process, and accordingly, an overall thickness of the display module package may be reduced.

However, the example embodiments are not limited thereto, and the first molding member 140 may enclose a side surface and an upper surface of the semiconductor chip 120 and an upper surface of the first molding member 140 may be disposed at a level higher than an upper surface of the semiconductor chip 120.

The first molding member 140 may include an insulating material. For example, the first molding member 140 may include a thermosetting resin such as an epoxy resin, a thermoplastic resin such as polyimide, a resin in which the thermosetting resin or the thermoplastic resin is mixed with a core material such as an inorganic filler or/and a glass fiber (or a glass cloth or a glass fabric), such as prepreg, an Ajinomoto Built-up Film (ABF), FR-4, bismaleimide triazine (BT). The first molding member 140 may be described as an insulating layer.

The second wiring member 150 may be disposed on the semiconductor chip 120 and the first molding member 140, and may have the second wiring layer 152. The second wiring member 150 may be electrically connected to the first wiring member 110 through the interconnect member 130. The second wiring member 150 may be referred to as an LED array substrate.

For example, the second wiring member 150 may include an insulating layer 151 directly disposed on an upper surface of the first semiconductor chip 120 and the first molding member 140, the second wiring layer 152 disposed on an upper surface of the insulating layer 151, and a wiring via 153 penetrating the insulating layer 151 and electrically connecting the second wiring layer 152 to the interconnect member 130. For example, though only one of these components is described, a plurality of each component may be present, at different vertical levels. For example, insulating layer 151 may be formed by a plurality of stacked insulating layers, also described as insulating sub-layers. Second wiring layer 152 may include a plurality of wiring layers, also described as wiring sub-layers. Wiring vias 153 may be at different vertical levels, connecting a respective wiring layer 152 to other wiring, and passing through a respective insulating layer 151. The number of each of the insulating layer 151, the second wiring layer 152, and the wiring via 153 of the second wiring member 150 may be higher or lower than the examples illustrated in the diagram.

The insulating layer 151 (e.g., each insulating sub-layer) may include an insulating material. When the insulating layer 151 includes a photosensitive resin (PID), the second wiring layer 152 and the wiring via 153 may be formed to have a fine form by a photolithography process. Accordingly, an overall thickness of the display module package may be reduced. However, an example embodiment thereof is not limited thereto. The second wiring member 150 may be configured as a substrate including a printed circuit board (PCB), a ceramic substrate, a tape wiring substrate, or the like.

The second wiring layer 152 may include a conductive material such as copper (Cu), aluminum (Al), silver (Ag), tin (Sn), gold (Au), nickel (Ni), lead (Pb), titanium (Ti), or alloys thereof. The wiring via 153 may include a conductive material, similarly to the second wiring layer 152. The wiring via 153 may be completely filled with a conductive material, or a conductive material may be disposed along a wall of the via. The wiring in the second wiring member 150 may be referred to as a wiring layer structure.

In an example embodiment, the second wiring member 150 may contact at least a portion of the semiconductor chip 120. For example, an upper surface of the semiconductor chip 120 may not be covered by the first molding member 140 or an insulating layer 151, and a lower surface of the second wiring member 150 may contact an upper surface of the semiconductor chip 120. The term "contact," as used herein, refers to a direction connection (i.e., touching) unless the context indicates otherwise. The lower surface of the second wiring member 150 may be coplanar with upper surfaces of the semiconductor chip 120, the first wiring member 110, and the interconnect member 130.

The light emitting device array 160 may be disposed on the second wiring member 150, may be electrically connected to the second wiring layer 152, may have a first surface facing the second wiring member 150 and a second surface opposite the first surface, and may include the plurality of light emitting devices 166 disposed on the second surface. The light emitting device array 160 may include a driver IC configured to drive the plurality of light emitting devices 166. For example, a driver IC including a thin film transistor (TFT), and the like, may be embedded in the light emitting device array 160, and the semiconductor chip 120 may transmit a driving signal to the plurality of light emitting devices 166 by controlling the driving circuit and may turn on the plurality of light emitting devices 166.

The driver IC may be embedded in the semiconductor chip 120 or the second wiring member 150, and in this case, the light emitting device array 160 may include an internal circuit (not illustrated) configured to transfer a driving signal transmitted from the driver IC to the plurality of light emitting devices 166 and to redistribute an electrode of each of the plurality of light emitting devices 166.

The light emitting device array 160 may be attached to the second wiring member 150 by an attachment member 165. The attachment member 165 may be an adhesive film or layer, such as a non-conductive film (NCF), an anisotropic conductive film (ACF), a UV sensitive film, a cyanoacrylate, a thermosetting adhesive, a laser curable adhesive or an ultrasonic curable adhesive, a non-conductive paste (NCP), and the like.

The plurality of light emitting devices 166 may be configured as light emitting diodes (LED) of various sizes. For example, an LED having a size (e.g., diameter) of several millimeters (mm) or several tens to several hundreds of millimeters (μm) may be used. To reduce a size of the display and to improve resolution of the display, a micro LED having a size less than 100 μm may be used.

In each of the plurality of light emitting devices 166, an LED chip 166R emitting red light, an LED chip 166G emitting green light, and an LED chip 166B emitting blue light may be arranged. The plurality of light emitting devices 166 may be arranged in accordance with a pitch, or the like, included in a display pixel.

In the example embodiment, the light emitting device array 160 may include a plurality of connection pads 162 disposed in an outer region of the second surface to surround the plurality of light emitting devices 166 and electrically connected to the plurality of light emitting devices 166. The plurality of connection pads 162 disposed in an outer region of the second surface may be electrically connected to the second wiring layer 152 of the second wiring member 150 by a bonding wire 164, and the plurality of connection pads 162 and the bonding wire 164 may be protected by the second molding member 170.

The second molding member 170 may be disposed on the second wiring member 150, and may seal a portion of the light emitting device array 160 to expose the plurality of light emitting devices 166. For example, the second molding member 170 may seal exposed electrically conductive components of the light emitting device array 160 (e.g., pads and wire bonding wires) and may have an opening 171 for exposing the plurality of light emitting devices 166. The opening 171 of the second molding member 170 may have a tapered shape such that a width of the opening 171 decreases in one direction. For example, the opening 171 of the second molding member 170 may have a tapered shape such that a width of the opening 171 decreases towards a surface of the light emitting device array 160 in which the plurality of light emitting devices 166 are disposed. The second molding member 170 may include an insulating material. For example, the second molding member 170 may include an epoxy-based resin, a silicon based resin, and the like.

FIGS. 4 to 10 are side cross-sectional diagrams illustrating a method of manufacturing a display module package illustrated in FIG. 1 according to an example embodiment.

Figure 4:
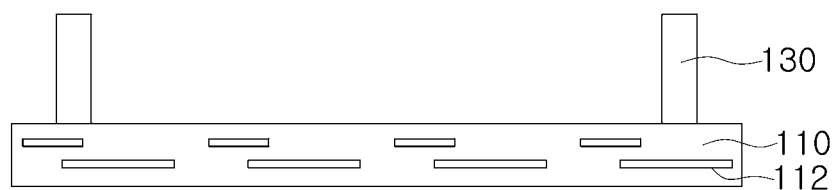
FIGS. 4 to 10 are side cross-sectional diagrams illustrating a method of manufacturing a display module package illustrated in FIG. 1 according to an example embodiment of the present inventive concept.

Referring to FIG. 4, the interconnect member 130 may be disposed on an upper surface of the first wiring member 110. The first wiring member 110 may include a printed circuit board (PCB), a ceramic substrate, and the like. The interconnect member 130 may be disposed in an outer region of the first wiring member 110. The interconnect member 130 may be configured as a conductive post, and may be a copper (Cu) post formed by a well-known method, for example. The interconnect member 130 may be electrically connected to the first wiring member 110.

Figure 5:
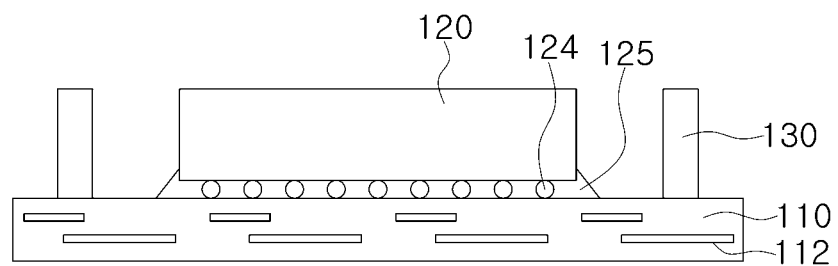

Referring to FIG. 5, the semiconductor chip 120 may be mounted on an upper surface of the first wiring member 110. For example, the semiconductor chip 120 may be mounted on the first wiring member 110 by a flip chip bonding method. The semiconductor chip 120 may be electrically connected to the first wiring member 110 through the connection members 124. The connection members 124 may be configured as solder balls or bumps, and may be connected to pads (not illustrated) disposed on an upper surface of the first wiring member 110. An underfill resin 125 sealing and supporting the connection members 124 may be disposed between the semiconductor chip 120 and the first wiring member 110.

Figure 6:
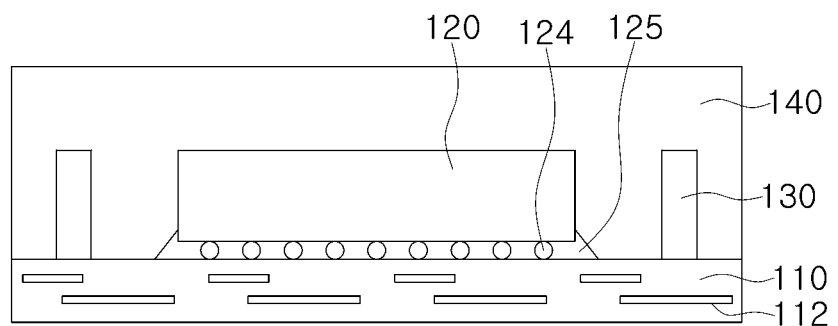

Referring to FIG. 6, the first molding member 140 may be disposed on the first wiring member 110. The first molding member 140 may be configured to cover an upper surface of the semiconductor chip 120 and the interconnect member 130. The first molding member 140 and the underfill resin 125 may include different materials or may include or be formed of the same material. Accordingly, processes for forming the underfill resin 125 and the first molding member 140 may not be distinct from each other.

Figure 7:
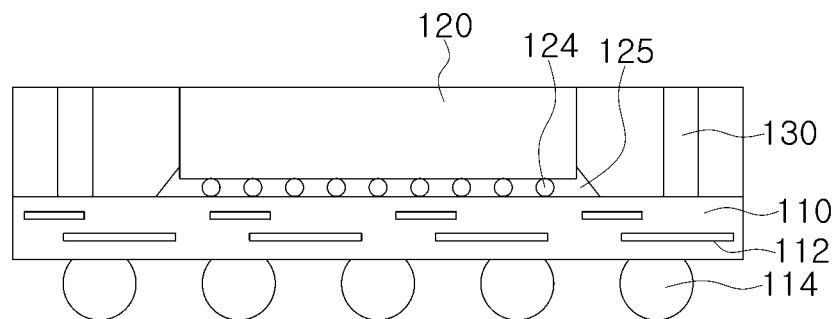

Referring to FIG. 7, a portion of an upper side of the first molding member 140 may be removed by a grinding process. A portion of the semiconductor chip 120 may also be removed while the portion of the first molding member 140 is removed such that a thickness of the semiconductor chip 120 is reduced. The first molding member 140 may be removed to expose an upper surface of each of the semiconductor chip 120 and the interconnect member 130. Accordingly, upper surfaces of the first molding member 140, the semiconductor chip 120, and the interconnect member 130 may be coplanar with one another.

Connection terminals 114 may be disposed at a lower portion of the first wiring member 110. The connection terminals 114 may be connected to pads (not illustrated) disposed on a lower surface of the first wiring member 110. The connection terminals 114 may be configured as solder balls. The connection terminals 114 may be formed while surfaces of the first molding member 140 and the semiconductor chip 120, planarized by the grinding process, are attached to a carrier. The connection terminals 114 may be sealed using a temporary protective film (not illustrated).

Figure 8:
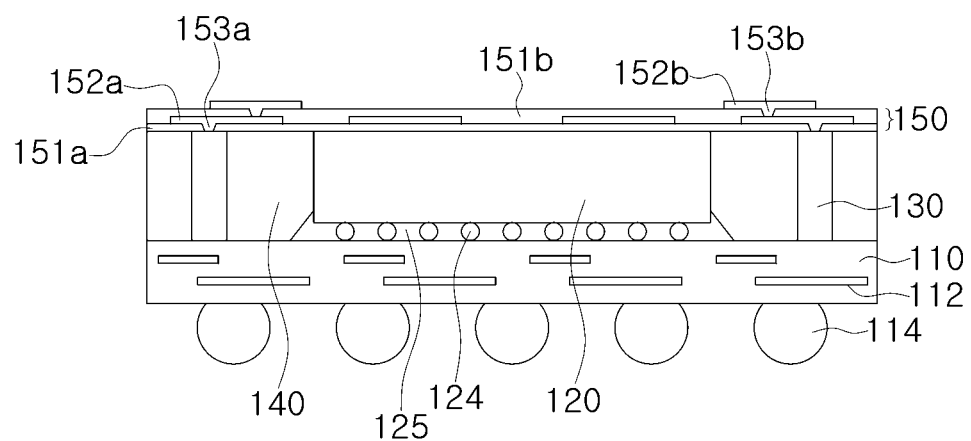

Referring to FIG. 8, the second wiring member 150 may be disposed on the semiconductor chip 120 and the first molding member 140. The second wiring member 150 may include a plurality of insulating layers 151a and 151b, a plurality of wiring layers 152a and 152b, and a plurality of wiring vias 153a and 153b if desired. As described above, by directly disposing the second wiring member 150 on a surface of the first molding member 140 planarized by removing the upper portion thereof, a thickness of the display module may be reduced, and a signal transfer distance between the semiconductor chip and the light emitting devices may be reduced.

The insulating layers 151a and 151b may be formed through a lamination process using a well-known lamination method and a curing process, or by coating a precursor using a well-known coating method and curing the precursor, or the like. The wiring layers 152a and 152b and the wiring vias 153a and 153b may be formed using a well-known plating process, and a via hole filled with the wiring vias 153a and 153b may be formed by a mechanical drill and/or a laser drill, or the like. Each wiring layer 152a or 152b may be integrally formed with its corresponding wiring via 153a or 153b, in a single process, and using a continuous material.

When the insulating layers 151a and 151b include a photosensitive resin, the wiring layers 152a and 152b and the wiring vias 153a and 153b may have a finer form through an exposure process and a developing process.

Figure 9:
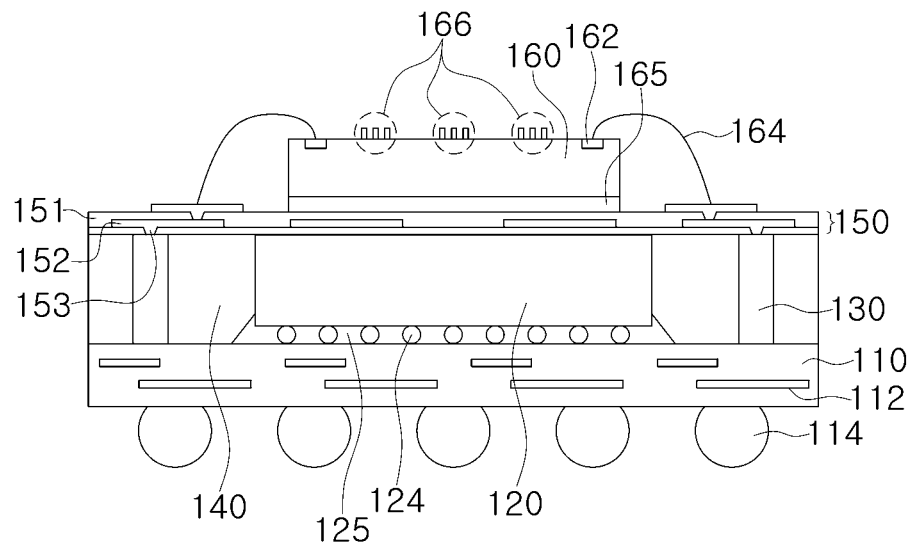

Referring to FIG. 9, the light emitting device array 160 is mounted on an upper surface of the second wiring member 150. The light emitting device array 160 may be attached to the second wiring member 150 using the attachment member 165. As the attachment member 165, a non-conductive film (NCF), an anisotropic conductive film (ACF), a UV sensitive film, a cyanoacrylate, a thermosetting adhesive, a laser curable adhesive and an ultrasonic curable adhesive, a non-conductive paste (NCP), or the like, may be used.

The light emitting device array 160 may include the plurality of connection pads 162 electrically connected to the plurality of light emitting devices 166, and the plurality of connection pads 162 may be electrically connected to the second wiring layer 152 of the second wiring member 150 by the bonding wire 164. However, the embodiments thereof is not limited thereto, and the plurality of connection pads 162 may be disposed on a surface facing the second wiring member 150 and may be electrically connected to the second wiring layer 152 of the second wiring member 150 by a flip chip bonding method.

Figure 10:
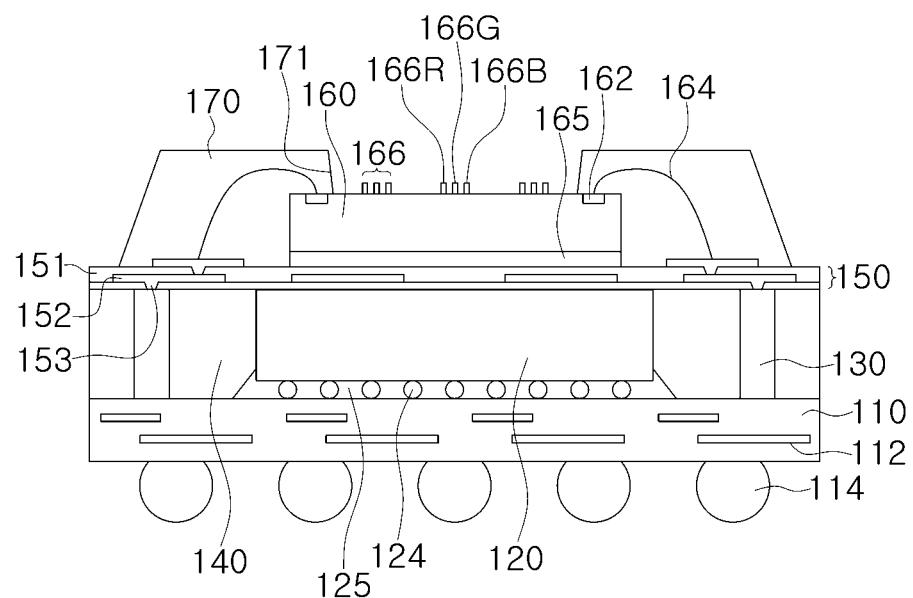

Referring to FIG. 10, a second molding member 170 partially sealing the light emitting device array 160 is formed. The second molding member 170 may be configured to have an opening 171 for exposing the plurality of light emitting devices 166 by a dispensing process, a screen-printing process, or the like. For example, a silicon paste may be dispensed continuously or several times on a partial region of the second wiring member 150 to cover the bonding wire 164 and the connection pads 162, thereby forming the second molding member 170 exposing the plurality of light emitting devices 166. As the second molding member 170, an epoxy resin, a silicon resin, or the like, may be used.

Figure 11:
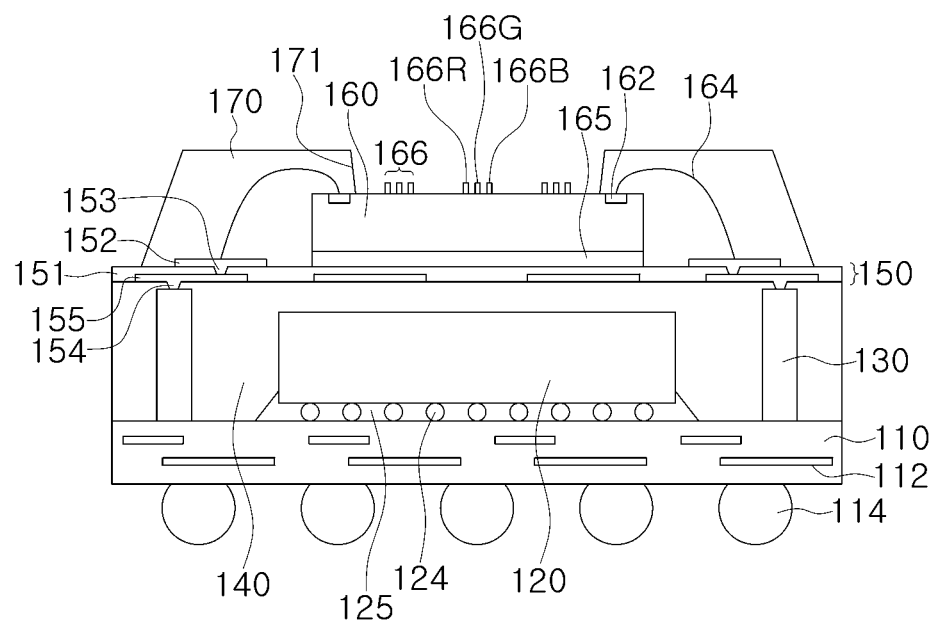
FIG. 11 is a side cross-sectional diagram illustrating a display module package according to an example embodiment of the present inventive concept.

FIG. 11 is a side cross-sectional diagram illustrating a display module package 100B according to an example embodiment.

Referring to FIG. 11, in the display module package 100B in the example embodiment, the first molding member 140 covers an upper surface of the semiconductor chip 120, and a lower surface of the insulating layer 151 of the second wiring member 150 contacts an upper surface of the first molding member 140. For example, the first molding member 140 covering the semiconductor chip 120 and the interconnect member 130 may be disposed on the first wiring member 110, and only a portion of the first molding member 140 may be removed to avoid exposing an upper surface of each of the semiconductor chip 120 and the interconnect member 130 in a process of planarizing an upper portion of the first molding member 140.

The second wiring member 150 may include a connection pattern 155 directly disposed on a planarized upper surface of the first molding member 140, and a connection via 154 penetrating a portion of the first molding member 140 and electrically connecting the connection pattern 155 to the interconnect member 130. The descriptions of the elements in the example embodiment may be the same as or similar to the descriptions of the display module package 100A illustrated in FIG. 1 unless otherwise indicated.

FIGS. 12 to 15 are side cross-sectional diagrams illustrating a method of manufacturing the display module package 100B illustrated in FIG. 11 according to an example embodiment.

Figure 12:
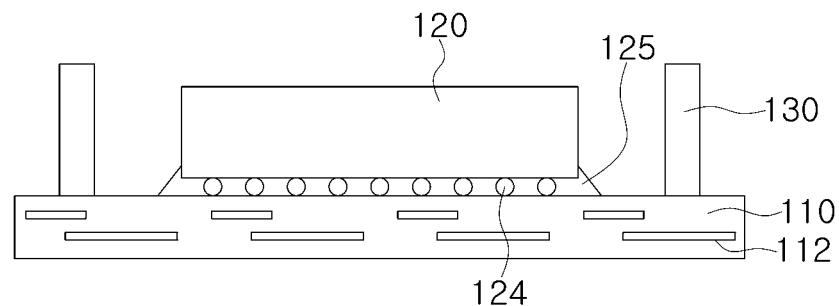
FIGS. 12 to 15 are side cross-sectional diagrams illustrating a method of manufacturing a display module package illustrated in FIG. 11 according to an example embodiment of the present inventive concept.

Referring to FIG. 12, the interconnect member 130 and the semiconductor chip 120 are disposed on the first wiring member 110 by a method the same as or similar to the method illustrated in FIGS. 4 and 5 described above.

Figure 13:
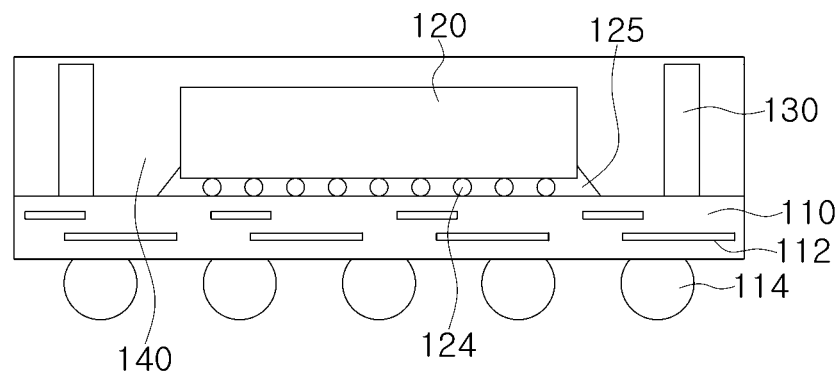

Referring to FIG. 13, a first molding member 140 covering the interconnect member 130 and the semiconductor chip 120 is formed on the first wiring member 110. An upper portion of the first molding member 140 may be ground by a grinding process, or the like. The grinding of the first molding member 140 may be performed so as not to expose an upper surface of either the semiconductor chip 120 or the interconnect member 130.

Figure 14:
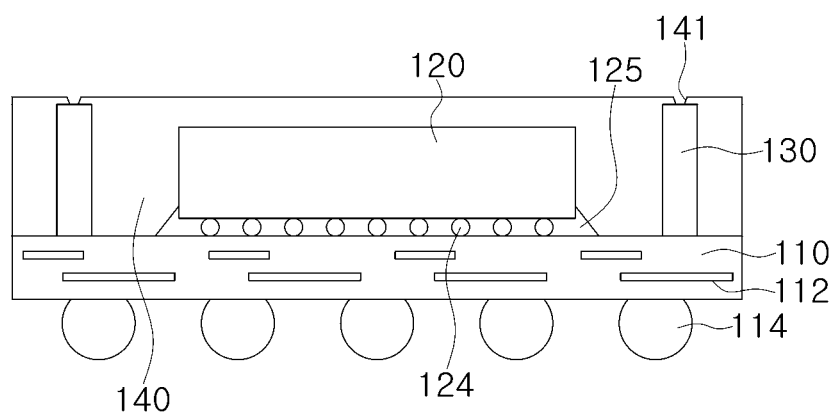

Referring to FIG. 14, a connection via hole 141 exposing an upper surface of the interconnect member 130 is formed on an upper surface of the first molding member 140. The connection via hole 141 may be formed using a mechanical drill and/or a laser drill, or the like. The connection via hole 141 may be formed using a photolithography process when the first molding member 140 includes a photosensitive resin.

Figure 15:
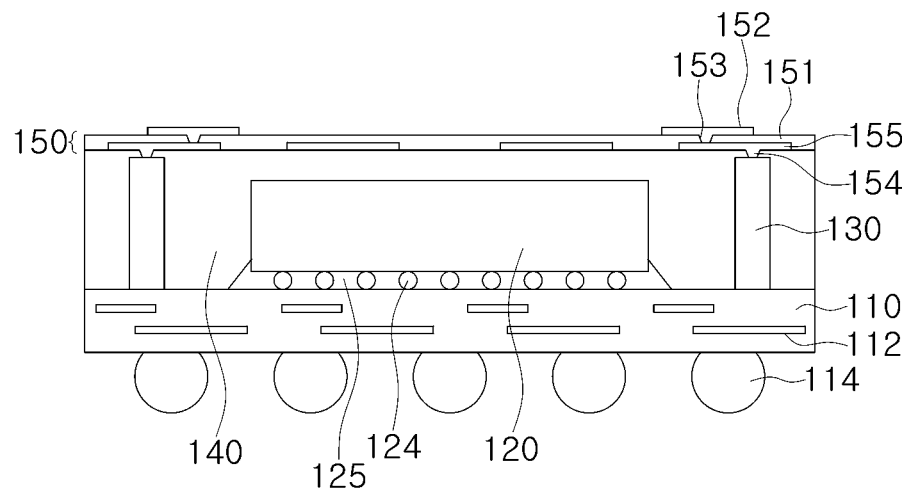

Referring to FIG. 15, the second wiring member 150 may be formed by a method the same as or similar to the aforementioned manufacturing method illustrated in FIG. 8. In the diagram, the second wiring member 150 may include a single insulating layer 151, a single wiring layer 152, and a single wiring via 153, and if desired, the second wiring member 150 may include a plurality of insulating layers 151, a plurality of second wiring layers 152, and a plurality of wiring vias 153.

Figure 16:
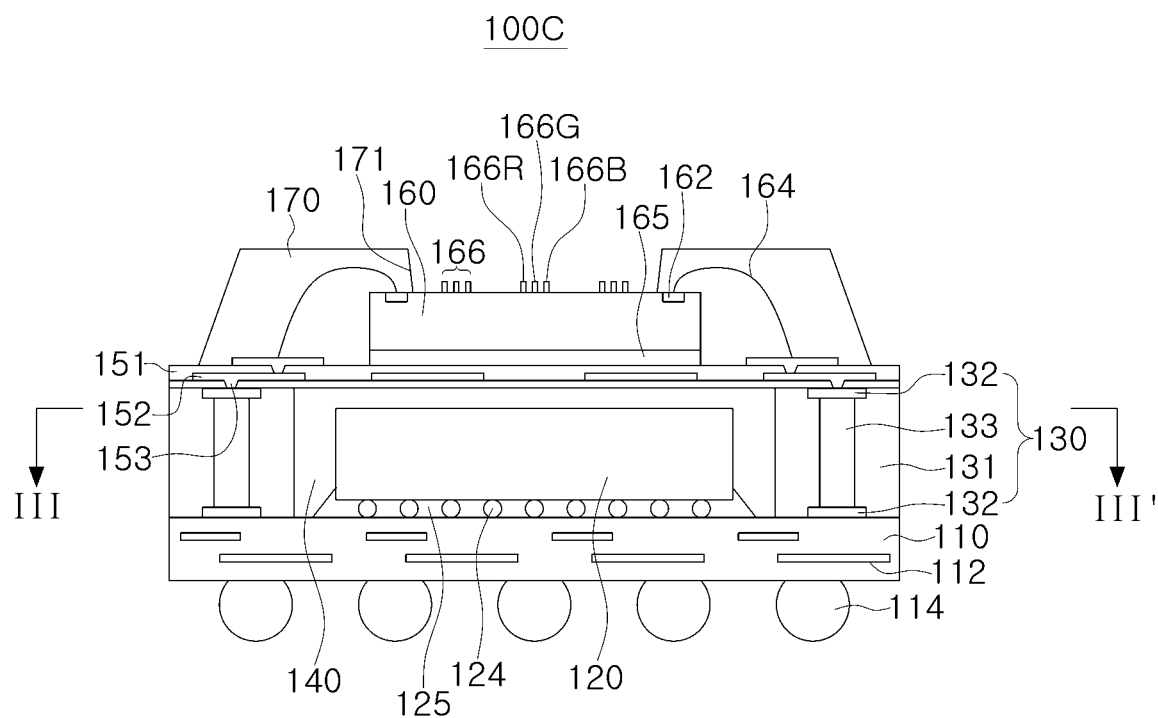
FIG. 16 is a side cross-sectional diagram illustrating a display module package according to an example embodiment of the present inventive concept.
Figure 17A:
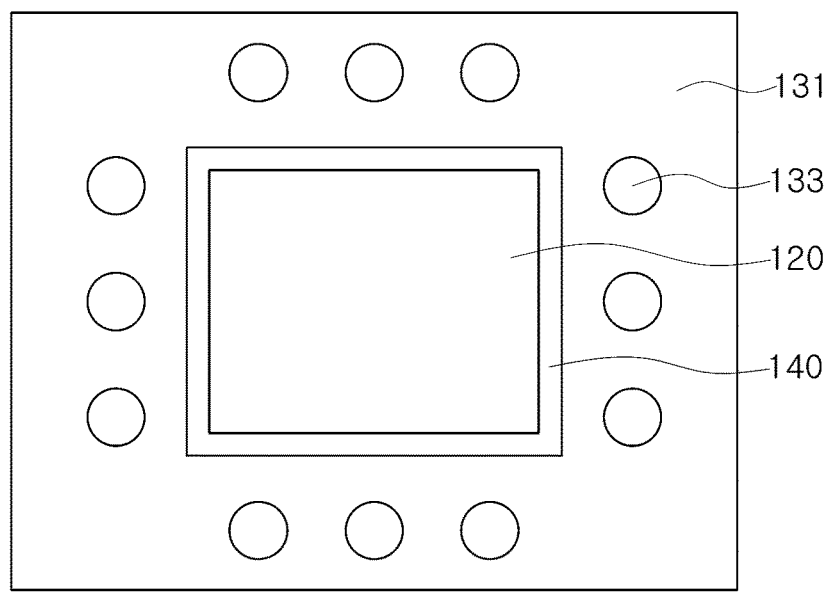
FIGS. 17A and 17B are cross-sectional diagrams taken along line in FIG. 16.
Figure 17B:
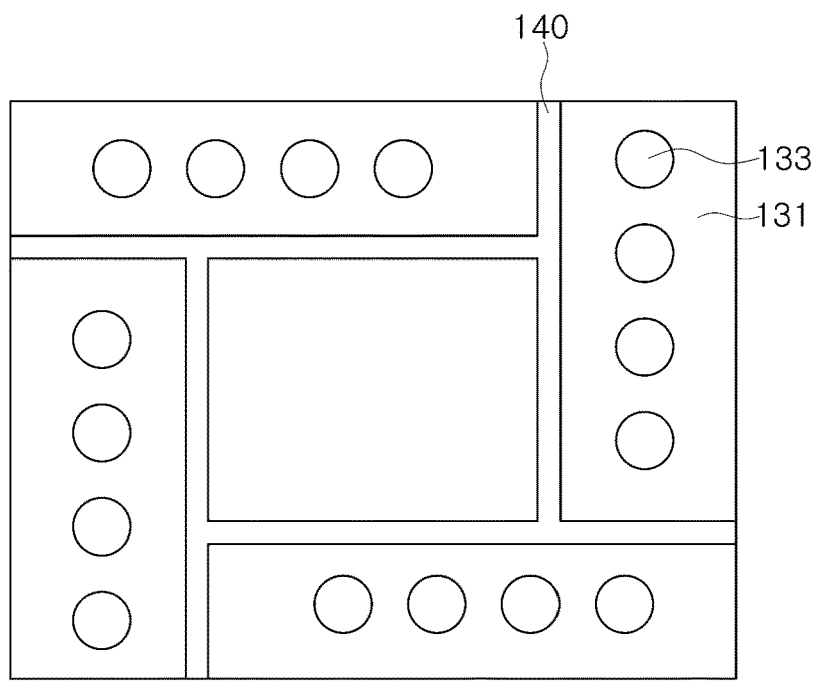

FIG. 16 is a side cross-sectional diagram illustrating a display module package 100C according to an example embodiment. FIGS. 17A and 17B are alternative cross-sectional diagrams taken along line in FIG. 16.

Referring to FIG. 16, in the display module package 100C in the example embodiment, an interconnect member 130 may include an insulating layer 131, and connection pads 132 disposed at an upper surface and a lower surface of the insulating layer 131, respectively, and electrically connected to each other. The connection pads 132 may be electrically connected to each other through a through via 133 penetrating the insulating layer 131. The insulating layer 131 may include a plurality of layers, and in this case, the connection pads 132 may be disposed in the insulating layers 131, respectively. Stiffness of the display module package may be improved depending on a material of the insulating layer 131. The insulating layer 131 may include an insulating material, and as an insulating material, a thermosetting resin such as an epoxy resin, a thermoplastic resin such as polyimide, a resin in which the thermosetting resin or the thermoplastic resin is mixed with a core material such as an inorganic filler or/and a glass fiber (or a glass cloth or a glass fabric), such as prepreg, an Ajinomoto Built-up Film (ABF), FR-4, bismaleimide triazine (BT), may be used.

The interconnect member 130 may be attached to a first wiring member 110 by a general conductive attachment member (not illustrated), or may be manufactured by directly forming the insulating layer 131, the connection pads 132, and the through via 133 on a wiring pattern of the first wiring member 110.

Referring to FIGS. 17A and 17B, the insulating layer 131 of the interconnect member 130 may have a lattice pattern, consecutively surrounding the semiconductor chip 120. In this case, the semiconductor chip 120 may be disposed in a space surrounded by the insulating layer 131. Alternatively, the interconnect member 130 may include a plurality of the insulating layers 131 separated from one another. In this case, a region between the plurality of separated insulating layers 131 may be filled with a first molding member 140 sealing the semiconductor chip 120. The descriptions of the elements in this example embodiment may be the same as or similar to the descriptions of the elements of the display module package 100A illustrated in FIG. 1 unless otherwise indicated.

Figure 18:
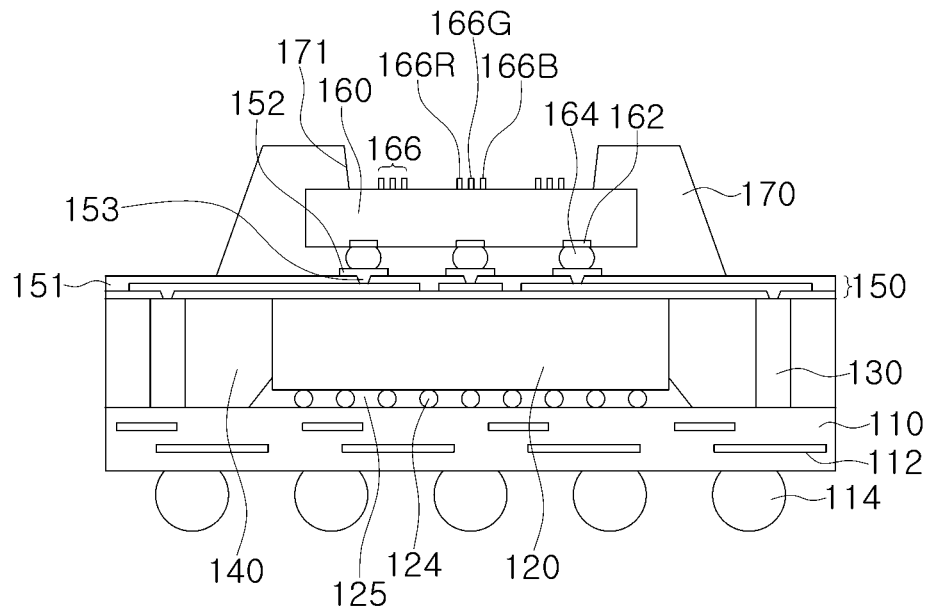
FIG. 18 is a side cross-sectional diagram illustrating a display module package according to an example embodiment of the present inventive concept.

FIG. 18 is a side cross-sectional diagram illustrating a display module package 100D according to an example embodiment.

Referring to FIG. 18, in the display module package 100D in the example embodiment, a light emitting device array 160 may be disposed on a first surface and may include a plurality of connection pads 162 electrically connected to the plurality of light emitting devices 166. The plurality of connection pads 162 may be electrically connected to a second wiring layer 152 of a second wiring member 150 by a conductive bump 164. In this case, the second molding member 170 may be only formed in a partial region in which the light emitting device array 160 is fastened and protected. Accordingly, a region in which the second molding member 170 is formed may be reduced more than in the example embodiment in which the light emitting device array 160 is connected to the second wiring member 150 by a bonding wire.

In the example in the diagram, the second molding member 170 may be formed from a side surface to a portion of an upper surface of the light emitting device array 160 to protect the light emitting device array 160, but the embodiments is not limited thereto. The second molding member 170 may be configured to only cover a lower region of the light emitting device array 160 to protect the conductive bump 164 disposed at a lower portion of the light emitting device array 160 and the second wiring layer 152 of the second wiring member 150. The descriptions of the elements in the example embodiment may be the same as or similar to the descriptions of the elements of the display module package 100A illustrated in FIG. 1 unless otherwise indicated.

Figure 19:
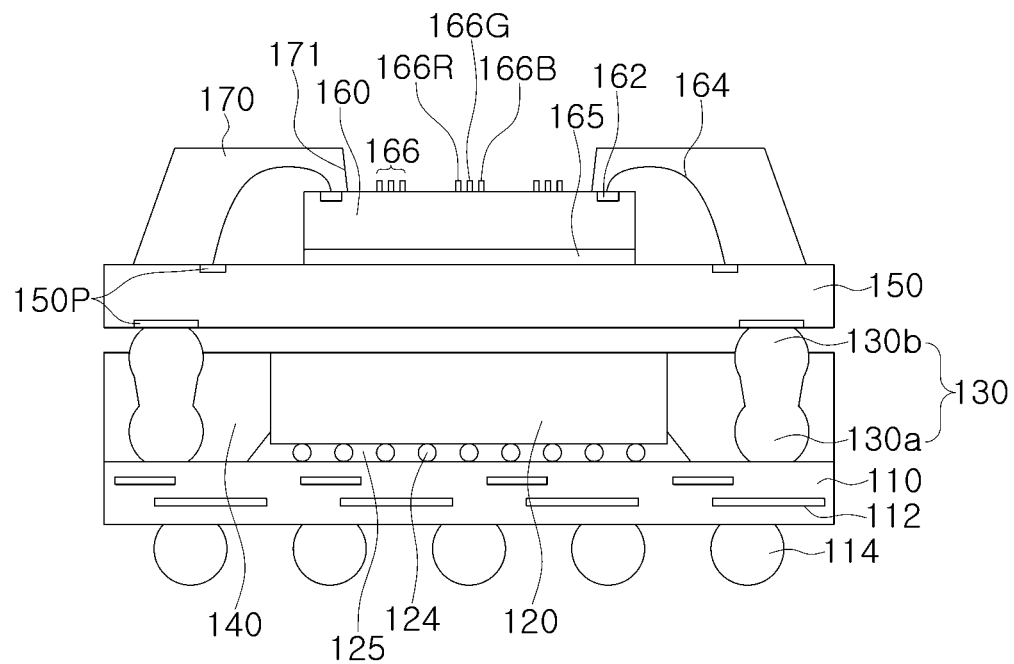
FIG. 19 is a side cross-sectional diagram illustrating a display module package according to an example embodiment of the present inventive concept.

FIG. 19 is a side cross-sectional diagram illustrating a display module package 100E according to an example embodiment.

Referring to FIG. 19, in the display module package 100E in this example embodiment, a second wiring member 150 may be configured as an interposer substrate including a printed circuit board (PCB), a ceramic substrate, and others. The second wiring member 150 may include a plurality of pads 150P disposed on an upper surface and a lower surface of the second wiring member 150 opposite each other. The pad 150P disposed on an upper surface of the second wiring member 150 may be electrically connected to a connection pad 162 of the light emitting device array 160 by a bonding wire 164. The pad 150P disposed on a lower surface of the second wiring member 150 may be electrically connected to the interconnect member 130. In the interconnect member 130, a lower connection member 130a and an upper connection member 130b may be coupled to each other. A lower surface of the second wiring member 150 may be spaced apart from an upper surface of the semiconductor chip 120 and an upper surface of the first molding member 140.

The lower connection member 130a may be electrically and/or physically connected to a first wiring member 110, and the upper connection member 130b may be electrically and/or physically connected to the second wiring member 150. The lower connection member 130a and the upper connection member 130b may be configured as solder balls, and may be integrated with each other.

Differently from the example embodiment illustrated in the diagram, a space between the second wiring member 150 and the first molding member 140 may be filled with an insulating material having excellent thermal conductivity to protect the semiconductor chip 120 and to dissipate heat from the semiconductor chip 120. The descriptions of the elements in the example embodiment may be the same as or similar to the descriptions of the elements of the display module package 100A illustrated in FIG. 1 unless otherwise indicated.

FIGS. 20 to 25 are side cross-sectional diagrams illustrating a method of manufacturing a display module package 100E according to an example embodiment.

Figure 20:
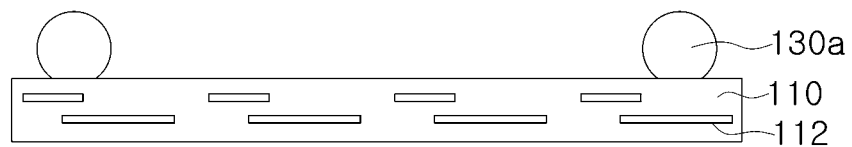
FIGS. 20 to 25 are side cross-sectional diagrams illustrating a method of manufacturing a display module package illustrated in FIG. 19 according to an example embodiment of the present inventive concept.

Referring to FIG. 20, a lower connection member 130a is disposed on a first wiring member 110. For example, the lower connection member 130a may be attached to an outer portion of an upper surface of the first wiring member 110. The lower connection member 130a may be electrically connected to the first wiring member 110. The lower connection member 130a may be configured as a solder ball, and may be attached to the first wiring member 110 using a thermo-compression process and/or a reflow process.

Figure 21:
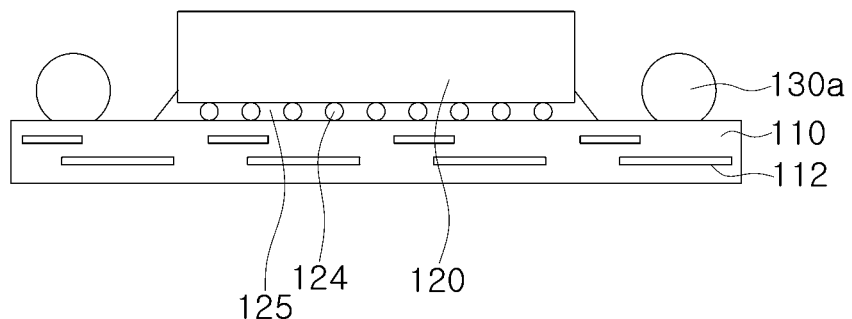

Referring to FIG. 21, a semiconductor chip 120 is mounted on the first wiring member 110. The semiconductor chip 120 may be disposed in a position surrounded by a plurality of lower connection members 130a. The semiconductor chip 120 may be electrically connected to the lower connection members 130a through the first wiring member 110. The semiconductor chip 120 may be mounted on the first wiring member 110 by a flip chip bonding method. The lower connection members 130a and the semiconductor chip 120 may be disposed on the first wiring member 110 in reverse chronological order, reverse from the aforementioned example embodiment, or may be disposed simultaneously.

Figure 22:
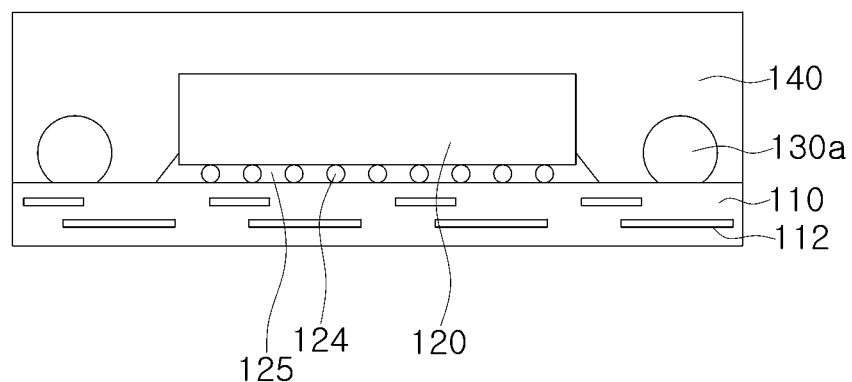

Referring to FIG. 22, a first molding member 140 sealing the semiconductor chip 120 may be disposed on the first wiring member 110. The first molding member 140 may include a material different from or the same as the underfill resin 125 as described in the example embodiment in FIG. 6. Differently from the example embodiment described in the diagram, the first molding member 140 may be disposed at a lower portion of the semiconductor chip 120 without using the underfill resin 125.

Figure 23:
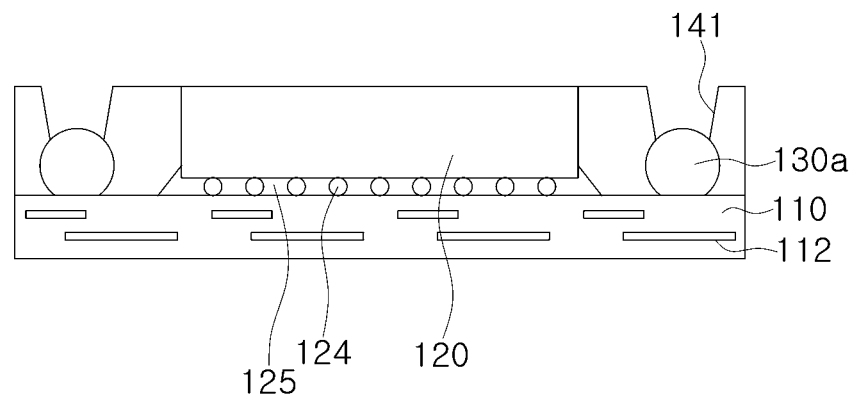

Referring to FIG. 23, an upper surface of the semiconductor chip 120 is exposed by removing a portion of the first molding member 140. A portion of an upper side of the semiconductor chip 120 may be removed, and accordingly, a thickness of the semiconductor chip 120 may be reduced. The first molding member 140 may be removed by a grinding process, or the like.

An opening 141 for exposing a portion of the lower connection member 130a may be formed (e.g., a plurality of openings for exposing a plurality of lower connection members). The opening 141 may be formed using a laser drill, or the like. The opening 141 may have a size in which only a portion of the lower connection member 130a is exposed, or may have a size in which an upper surface of each of the lower connection member 130a and the first wiring member 110 is exposed.

Figure 24:
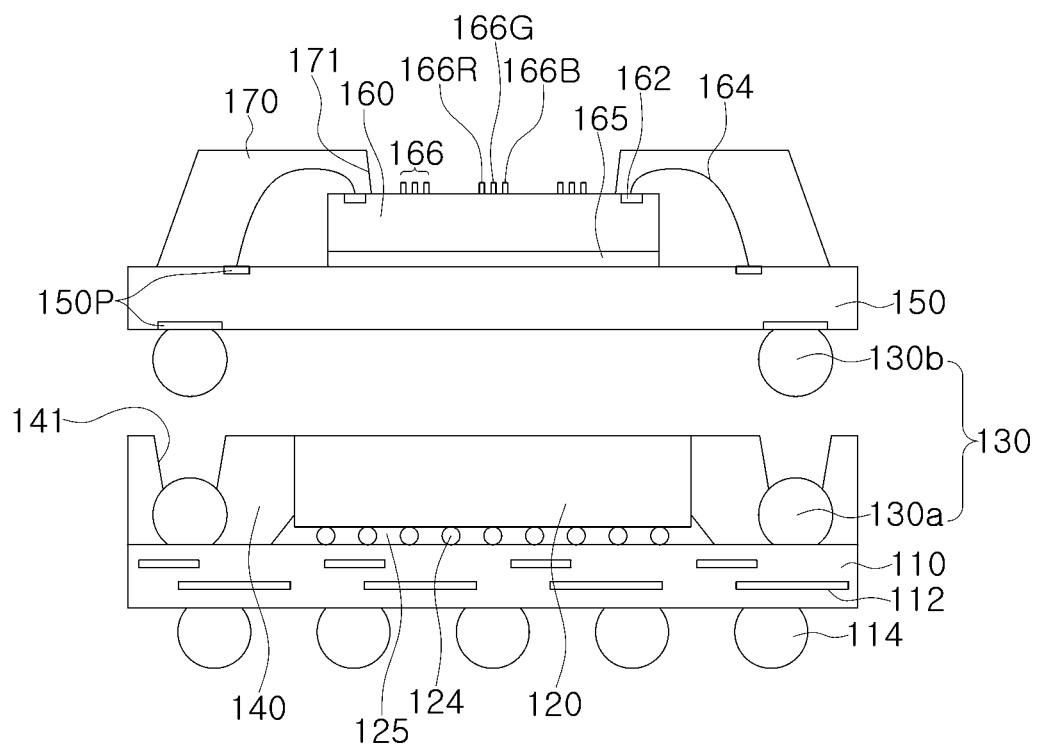

Referring to FIG. 24, an upper connection member 130b is disposed on a lower surface of the second wiring member 150. The upper connection member 130b may be disposed in a position to contact the lower connection member 130a through the opening 141. The upper connection member 130b may be inserted into the opening 141 and may be electrically and/or physically connected to the lower connection member 130a. A spacing space may be formed between the upper connection member 130b and the lower connection member 130a while the upper connection member 130b is inserted into the opening 141.

Figure 25:
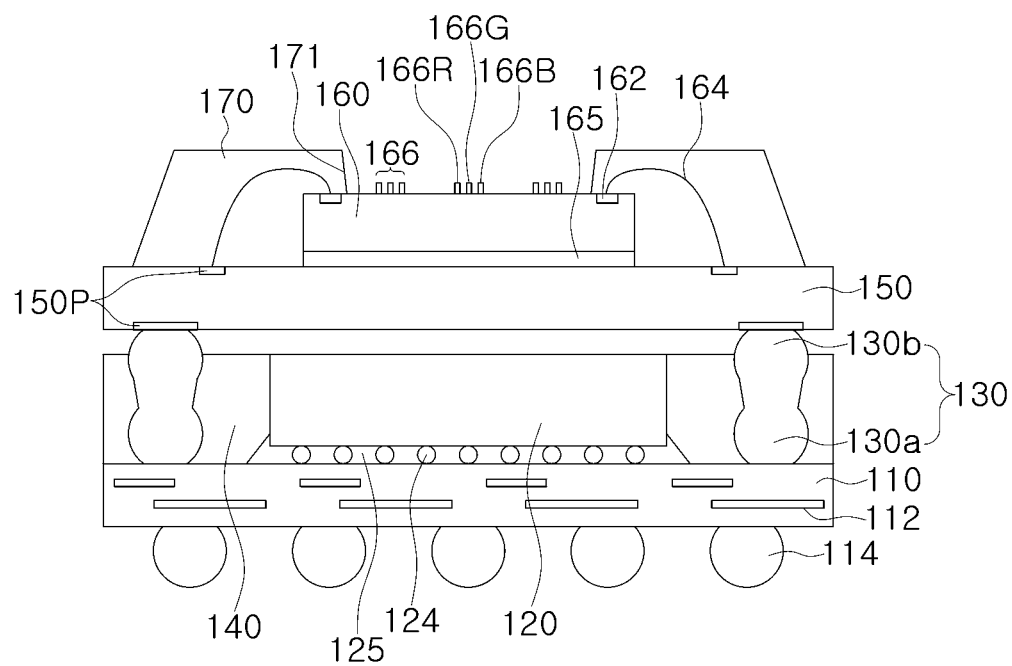

Referring to FIG. 25, the lower connection member 130a and the upper connection member 130b may be integrated with each other by a thermo-compression process and/or a reflow process to form a connection member 130, also described as a vertical connection member or vertical connection electrode. Accordingly, shapes of the lower connection member 130a and the upper connection member 130b may change, and accordingly, an electrical path connecting the first wiring member 110 and the second wiring member 150 to each other may be formed.

Figure 26:
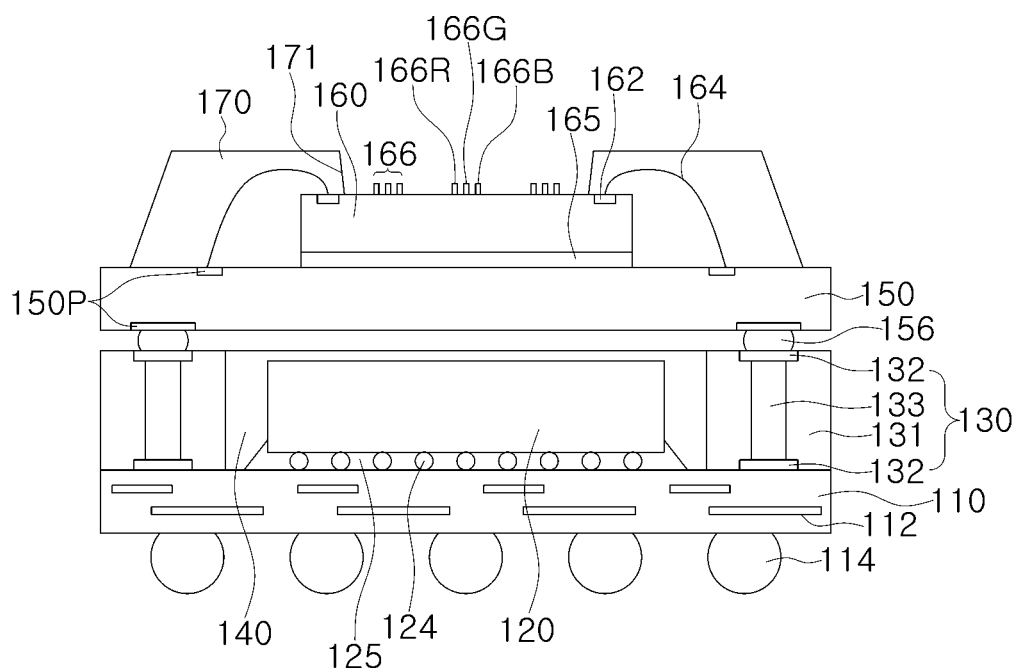
FIG. 26 is a side cross-sectional diagram illustrating a display module package according to an example embodiment of the present inventive concept.

FIG. 26 is a side cross-sectional diagram illustrating a display module package 100F according to an example embodiment.

Referring to FIG. 26, in the display module package 100F in the example embodiment, a second wiring member 150 is connected to an interconnect member 130 by a connection terminal 156, and the interconnect member 130 may include an insulating layer 131 and connection pads 132 disposed at an upper surface and a lower surface of the insulating layer 131, respectively, and electrically connected to each other. The descriptions of the interconnect member 130 may be the same as in the aforementioned example embodiments described with reference to FIGS. 16, 17A and 17B. The descriptions of the elements in the example embodiment may be the same as or similar to the descriptions of the elements of the display module package 100A illustrated in FIG. 1 unless otherwise indicated.

According to the aforementioned example embodiments, by embedding the light emitting devices and the semiconductor chip controlling the light emitting devices in a single module package, a display module package having a reduce thickness and a reduce size may be provided.

Also, by reducing a signal transfer distance between the light emitting devices and the semiconductor chip controlling the light emitting devices, a display module package in which a response delay time of a display is reduced may be provided.

While the example embodiments have been shown and described above, it will be apparent to those skilled in the art that modifications and variations could be made without departing from the scope of the present invention as defined by the appended claims.

What is claimed is:

1. A display module package, comprising:
a first wiring layer structure having a first wiring layer;
a semiconductor chip disposed on the first wiring layer structure and electrically connected to the first wiring layer of the first wiring layer structure;
a first molding member disposed on the first wiring layer structure and encapsulating at least a portion of the semiconductor chip;
a second wiring layer structure disposed on the semiconductor chip and the first molding member and having a second wiring layer;
a vertical connection electrode disposed between the first wiring layer structure and the second wiring layer structure and electrically connecting the first wiring layer to the second wiring layer;
a light emitting device array disposed on the second wiring layer structure, electrically connected to the second wiring layer, having a first surface facing the second wiring layer structure and a second surface opposite the first surface, and including a plurality of light emitting devices disposed on the second surface; and
a second molding member disposed on the second wiring layer structure and sealing part of the light emitting device array to expose the plurality of light emitting devices.

2. The display module package of claim 1, wherein the second wiring layer structure includes an insulting layer disposed on the semiconductor chip and the first molding member, the second wiring layer disposed on the insulating layer, and a wiring via penetrating the insulating layer and electrically connecting the second wiring layer to the vertical connection electrode.

3. The display module package of claim 1, further comprising:
connection members disposed on a lower surface of the semiconductor chip and electrically connected to the first wiring layer;
an underfill resin disposed between the first wiring layer structure and the semiconductor chip and covering the connection members; and
external connection terminals disposed on a lower surface of the first wiring layer structure and electrically connected to the first wiring layer,
wherein at least a set of the external connection terminals is disposed in a region which does not overlap the semiconductor chip from a top-down view.

4. The display module package of claim 1, wherein a lower surface of the second wiring layer structure is spaced apart from an upper surface of the semiconductor chip and an upper surface of the first molding member.

5. The display module package of claim 1,
wherein the light emitting device array includes a plurality of connection pads disposed on the first surface of the light emitting device array and electrically connected to the plurality of light emitting devices, and
wherein the plurality of connection pads are electrically connected to the second wiring layer of the second wiring layer structure by a conductive bump.

6. The display module package of claim 1, wherein the vertical connection electrode is disposed at an outer region of the first wiring layer structure to surround the semiconductor chip, and is configured as a conductive post penetrating the first molding member.

7. The display module package of claim 1, wherein the vertical connection electrode passes through an insulating layer, and is connected to connection pads that are disposed on an upper surface and a lower surface of the insulating layer, respectively, and are electrically connected to each other.

8. The display module package of claim 1, wherein the second molding member includes a silicon-based resin.

9. The display module package of claim 1,
wherein the first molding member covers an upper surface of the semiconductor chip, and
wherein a lower surface of the second wiring layer structure contacts an upper surface of the first molding member.

10. The display module package of claim 9, wherein the second wiring layer structure includes a connection pattern disposed on the upper surface of the first molding member and a connection via penetrating a portion of the first molding member and connecting the connection pattern to the vertical connection electrode.

11. The display module package of claim 1,
wherein the light emitting device array includes a plurality of connection pads disposed in an outer region of the second surface of the light emitting device array to surround the plurality of light emitting devices and electrically connected to the plurality of light emitting devices, and
wherein the plurality of connection pads are electrically connected to the second wiring layer of the second wiring layer structure by a bonding wire.

12. The display module package of claim 11, wherein the second molding member is configured to cover the plurality of connection pads and the bonding wire.

13. The display module package of claim 1, wherein a lower surface of the second wiring layer structure contacts an upper surface of the semiconductor chip.

14. The display module package of claim 13, wherein an upper surface of the semiconductor chip is coplanar with an upper surface of the first molding member.

15. The display module package of claim 14, wherein an upper surface of the vertical connection electrode is coplanar with the upper surface of the first molding member.

16. A display module package, comprising:
a semiconductor chip;
a wiring member disposed on the semiconductor chip, including an insulating layer and a wiring layer, and contacting at least a portion of the semiconductor chip;
a light emitting device array disposed on the wiring member and including a plurality of light emitting devices disposed on one surface, wherein the wiring member is between the semiconductor chip and the light emitting device; and
a molding member disposed on the wiring member, sealing part of the light emitting device array, and having an opening for exposing the plurality of light emitting devices.

17. The display module package of claim 16, wherein the opening of the molding member has a tapered internal wall such that a width of the opening decreases in a direction toward a surface of the light emitting device array.

18. The display module package of claim 17, further comprising:
a bonding wire electrically connecting the light emitting device array to the wiring member,
wherein the semiconductor chip includes a chip configured to control the plurality of light emitting devices.

19. The display module package of claim 18, wherein the molding member exposes at least a portion of an end of the wiring member.

20. A display module package, comprising:
a first wiring member including a first wiring layer and connection terminals electrically connected to the first wiring layer;
a semiconductor chip disposed on the first wiring member and including connection members electrically connected to the first wiring layer;
an underfill resin disposed between the first wiring member and the semiconductor chip and covering the connection members;
a first molding member disposed on the first wiring member, and sealing the semiconductor chip and the underfill resin;
a second wiring member disposed on the semiconductor chip and the first molding member, and including an insulating layer and a second wiring layer disposed on the insulating layer;
a vertical connection electrode disposed between the first wiring member and the second wiring member, penetrating the first molding member, and electrically connecting the first wiring member to the second wiring member;
a light emitting device array disposed on the second wiring member, including a plurality of light emitting devices disposed on one surface, and electrically connected to the second wiring member through a bonding wire;
an attachment member disposed between the second wiring member and the light emitting device array; and
a second molding member disposed on the second wiring member, encapsulating the bonding wire and part of the light emitting device array, and having an opening for exposing the plurality of light emitting devices,
wherein the second wiring member contacts the semiconductor chip and the first molding member.

* * * * *